(12) United States Patent
Chen et al.

(10) Patent No.: US 8,848,351 B2
(45) Date of Patent: Sep. 30, 2014

(54) FRAME FOR LCD DEVICE AND LCD DEVICE

(75) Inventors: Shihhsiang Chen, Shenzhen (CN); Chengwen Que, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 233 days.

(21) Appl. No.: 13/511,403

(22) PCT Filed: Apr. 23, 2012

(86) PCT No.: PCT/CN2012/074502
§ 371 (c)(1),
(2), (4) Date: May 23, 2012

(87) PCT Pub. No.: WO2013/152523
PCT Pub. Date: Oct. 17, 2013

(65) Prior Publication Data
US 2013/0271898 A1 Oct. 17, 2013

(30) Foreign Application Priority Data
Apr. 11, 2012 (CN) .......................... 2012 1 0104134

(51) Int. Cl.
*G06F 1/16* (2006.01)
(52) U.S. Cl.
USPC .................... 361/679.24; 455/456.1; 349/189; 345/207
(58) Field of Classification Search
USPC ............. 455/575.1, 575.2, 575.3, 550.1, 558, 455/347, 419, 51, 556, 456.1, 436, 414.1, 455/411, 415, 404.1; 349/84, 58, 65, 40, 349/43, 143, 155, 157, 62, 187, 189; 345/173, 690, 102, 76, 1.1, 204, 420, 345/207, 156, 419, 212, 211, 92, 659; 361/679.21, 679.22, 679.23, 679.26, 361/679.31, 679.33, 679.34, 679.47, 361/679.52, 679.55, 679.27, 679.02, 361/679.32, 679.01, 679.57, 679.03; 347/7, 347/14
See application file for complete search history.

(56) References Cited

U.S. PATENT DOCUMENTS

| | | | | |
|---|---|---|---|---|
| 6,016,176 A | * | 1/2000 | Kim et al. | 349/84 |
| 7,639,316 B2 | | 12/2009 | Fukuda | |
| 2006/0146488 A1 | * | 7/2006 | Kimmel | 361/681 |
| 2007/0008687 A1 | | 1/2007 | Fukuda | |
| 2010/0041449 A1 | * | 2/2010 | Nakao et al. | 455/575.3 |
| 2010/0182265 A1 | * | 7/2010 | Kim et al. | 345/173 |

FOREIGN PATENT DOCUMENTS

| | | |
|---|---|---|
| CN | 1472748 A | 2/2004 |
| CN | 1637500 A | 7/2005 |
| CN | 101194218 A | 6/2008 |
| CN | 101504509 A | 8/2009 |
| CN | 201489228 U | 5/2010 |
| CN | 201577144 U | 9/2010 |
| CN | 202110517 U | 1/2012 |

OTHER PUBLICATIONS

Guan Yuan, the International Searching Authority written comments, Jan. 2013, CN.

* cited by examiner

*Primary Examiner* — Hung Duong
(74) *Attorney, Agent, or Firm* — Na Xu; Ipro, Inc.

(57) ABSTRACT

The invention relates to the field of LCDs, and more particularly to a frame for an LCD device and an LCD device including the frame. The frame includes side frames. A pair of parallel side frames of the side frames are correspondingly provided with folding points, and the frame is folded and superposed along the folding points. The frame for an LCD device of the invention is of a rectangle structure in general, and includes four side frames; a pair of parallel side frames are correspondingly provided with folding points, and the frame is folded and superposed along the folding points; because the frame is folded and superposed along the folding points, the area of the frame is significantly reduced during packaging and transportation, thereby facilitating transportation, saving packaging material, and increasing packaging efficiency. When assembling the LCD device, the frame can be conveniently expanded.

15 Claims, 4 Drawing Sheets

FRAME FOR LCD DEVICE AND LCD DEVICE

TECHNICAL FIELD

The invention relates to the field of liquid crystal displays (LCDs), and more particularly to a frame for an LCD device and an LCD device comprising the same.

BACKGROUND

As shown in FIG. 1, a conventional LCD device generally includes a front frame 1, an LCD panel 2, a middle frame 3, a backlight module 4, a back cover 5, and the like. The backlight module 4 includes an optical film, a light guide panel (LGP), a lightbar, and the like. The front frame 1, the middle frame 3, and the back cover 5 have different functions, respectively. The front frame 1 is mainly used for fixing the LCD panel 2 and preventing the LCD panel 2 from escaping the position. The middle frame 3 is mainly used for bearing the LCD panel 2 and shielding partial light leakage from the backlight module 4. The back cover 5 is mainly used for bearing the optical film, the LGP, the lightbar, and the like, and ensuring the planeness of the backlight module 4.

The size of the LCD devices in the prior art becomes larger and larger, and the size of the front frame and the middle frame becomes larger and larger correspondingly. Because the front frame and the middle frame are required to be transported to an assembly factory from parts factory, during packaging and transportation, the larger the size of the frames is, the more disadvantageous the transportation is. Furthermore, the frames of large size have the disadvantages that the packaging material is wasted, and the packaging efficiency is affected, which need to be solved urgently.

SUMMARY

In view of the above-described problems, the aim of the invention is to provide a frame for an LCD device with the advantages of convenient package and transportation and an LCD device using the frame.

A first technical scheme of the invention is that: a frame for an LCD device comprises side frames; a pair of parallel side frames of the side frames are correspondingly provided with folding points, and the frame is folded and superposed along the folding points. Two connecting ends are formed at the folding points of the side frames provided with the folding points, and the two connecting ends are riveted or connected by a pin. One connecting end of the two connecting ends is provided with a first through hole, and the first through hole is provided with a folding edge of inner hole, the other connecting end is provided with a second through hole corresponding to the folding edge. The two connecting ends are riveted by the folding edge and the through holes thereof. Each side frame is L-shaped in the cross section thereof, and comprises a horizontal edge which is in parallel with the plane of the frame, and a vertical edge which is perpendicular to the horizontal edge. The vertical edges of the two connecting ends are mutually riveted or connected by a pin, and the horizontal edges of the two connecting ends are mutually butted when the frame is fully expanded. The frame is of a separated structure, and comprises a plurality of frame members; the frame is formed by the frame members, the folding points are positioned on the longer side frames, and the folding points are positioned in the middle of the longer side frames.

A second technical scheme of the invention is that: a frame for an LCD device comprises side frames; a pair of parallel side frames of the side frames are correspondingly provided with folding points, and the frame is folded and superposed along the folding points.

Preferably, two connecting ends are formed at the folding points of the side frames provided with the folding points, and the two connecting ends are riveted or connected by a pin.

Preferably, one connecting end of the two connecting ends is provided with a first through hole, the first through hole is provided with a folding edge of inner hole, the other connecting end is provided with a second through hole corresponding to the folding edge, and the two connecting ends are riveted by the folding edge and the through holes thereof, thereby reducing cost, and reducing material type.

Preferably, each side frame is L-shaped in the cross section thereof, and comprises a horizontal edge which is in parallel with the plane of the frame, and a vertical edge which is perpendicular to the horizontal edge; the vertical edges of the two connecting ends are mutually riveted or connected by a pin, thereby better ensuring the dimension stability and the straightness of the frame.

Preferably, the horizontal edges of the two connecting ends are mutually butted when the frame is fully unfolded, thereby preventing the frame from being excessively rotated, and ensuring the strength of the frame.

Preferably, the folding points are positioned on the longer side frames, and the folding points are positioned in the middle of the longer side frames. Thus, after being folded, the area of the frame is only a half of that of the original frame, and the length is reduced by half, thereby facilitating transportation. The scheme is one of the preferable schemes.

Preferably, the side frames are provided with two or more pairs of folding points, thereby making the area of the folded frame become smaller, and facilitating package and transportation.

Preferably, the frame is of a separated structure, and comprises a plurality of frame members; the frame is formed by the frame members, and the folding points are positioned on the frame members. Because the generality of frame members is high, the frame members with different number and length can form frames with different sizes; thus, the cost of the frame is reduced, and the development cycle of the frame is shortened.

Preferably, the frame is a front frame or a middle frame.

The invention further provides a third technical scheme: an LCD device comprises the frame mentioned above.

Advantages of the invention are summarized below: the frame for an LCD device of the invention is of a rectangle structure in general, and comprises four side frames; a pair of parallel side frames are correspondingly provided with folding points, and the frame is folded and superposed along the folding points. Because the frame is folded and superposed along the folding points, the area of the frame is significantly reduced during packaging and transportation, thereby facilitating transportation, saving packaging material, and increasing packaging efficiency. When assembling the LCD device, the frame can be conveniently expanded.

Legends: 1. front frame; 2. LCD panel; 3. middle frame; 4. backlight module; 5. back cover; 6. side frame; 61. horizontal edge; 62. vertical edge; 63. folding point; 64. folding edge.

DETAILED DESCRIPTION

Figure 1:
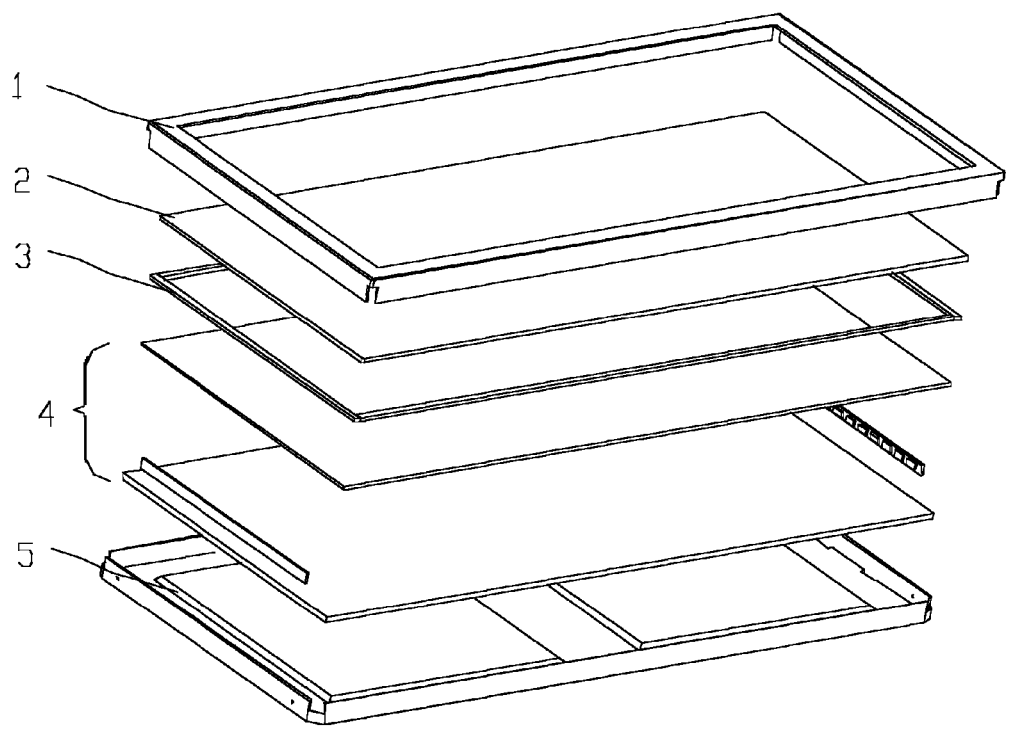
FIG. 1 is a structure diagram of an LCD device in the prior art.
Figure 2:
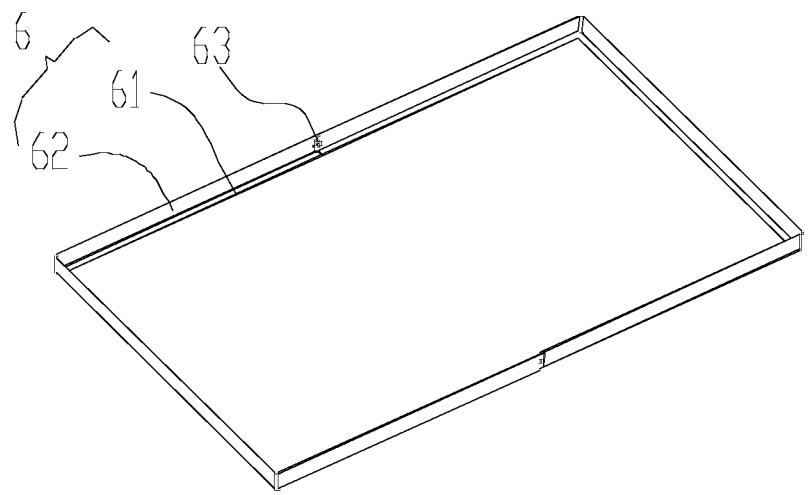
FIG. 2 is a structure diagram of an example of a frame for an LCD device in an unfolded state of the invention.
Figure 3:
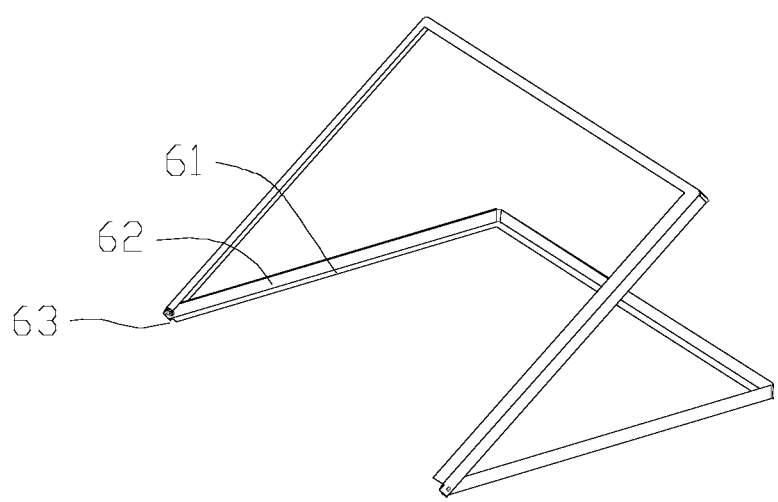
FIG. 3 is a structure diagram of an example of a frame for an LCD device in a half-folded state of the invention.
Figure 4:
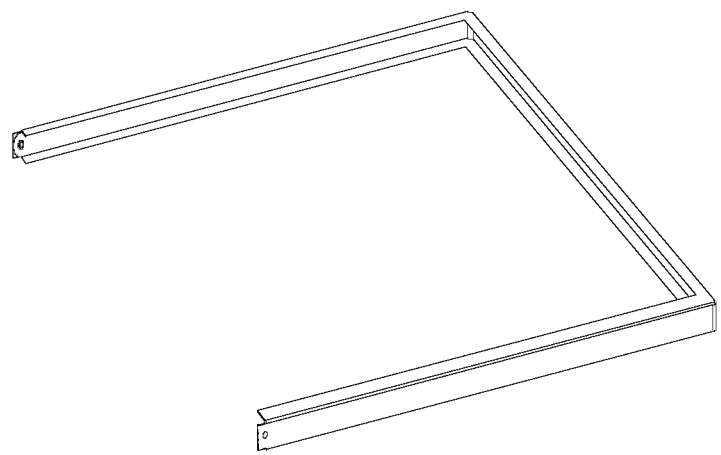
FIG. 4 is a structure diagram of an example of a frame for an LCD device in a folded state of the invention.
Figure 5:
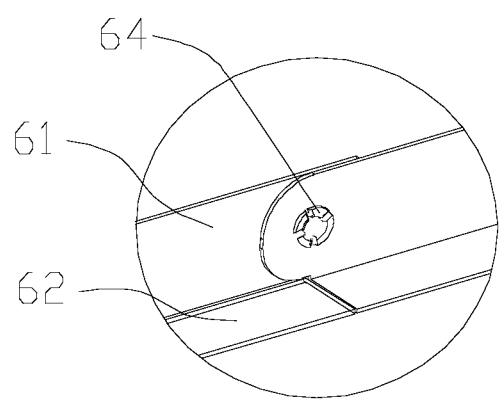
FIG. 5 is a structure diagram of a frame for an LCD device in a packaged state of the invention.
Figure 6:
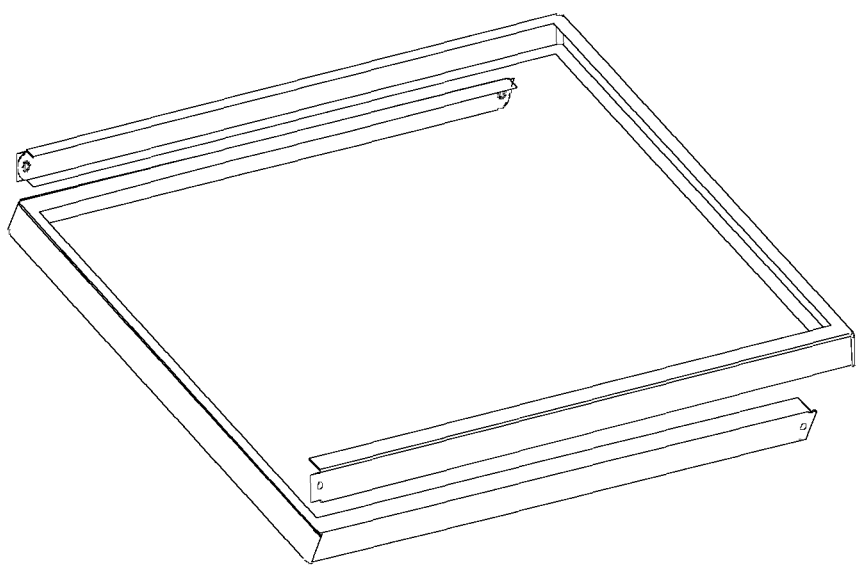
FIG. 6 is a structure diagram of folding points of a frame for an LCD device of the invention.

The invention provides an LCD device, comprising a frame. The frame is a front frame or a middle frame. FIG. 2 to FIG. 6 show a first example of the frame for an LCD device of the invention. The frame comprises side frames 6; a pair of parallel side frames of the side frames 6 are correspondingly provided with folding points 63, and the frame is folded and superposed along the folding points 63.

The frame for an LCD device of the invention is of a rectangle structure in general, and comprises four side frames 6. A pair of parallel side frames are correspondingly provided with folding points 63, and the frame is folded and superposed along the folding points 63; because the frame is folded and superposed along the folding points 63, the area of the frame is significantly reduced during packaging and transportation, thereby facilitating transportation, saving packaging material, and increasing packaging efficiency. When assembling the LCD device, the frame can be conveniently expanded.

In the example, the folding points 63 are positioned on the longer side frames, and the folding points 63 are positioned in the middle of the longer side frames. Thus, after being folded, the area of the frame becomes only a half of that of the original frame, and the length is reduced by half, thereby facilitating transportation. The scheme is one of the preferable schemes. Optionally, the folding points 63 can be positioned on short side frames, just resulting in slightly bad effect.

In the example, the side frames 6 provided with the folding points 63 are provided with two connecting ends at the folding points 63. The two connecting ends are riveted. Specifically, each side frame is L-shaped in the cross section thereof, and comprises a horizontal edge 61 which is in parallel with the plane of the frame, and a vertical edge 62 which is perpendicular to the horizontal edge 61. The vertical edges 62 of the two connecting ends are mutually riveted, thereby better ensuring the dimension stability and straightness of the frame. The vertical edges 62 of the two connecting ends are riveted by a rivet, or one connecting end of the two connecting ends is provided with a first through hole, the first through hole is provided with a folding edge 64 of inner hole, the other connecting end is provided with a second through hole corresponding to the folding edge 64, and the two connecting ends are riveted by the folding edge 64 and the through holes thereof, thereby reducing cost, and reducing material type.

Because the frame of the invention is folded and superposed along the folding points, the two connecting ends cannot be tightly riveted, so as to axially rotate the two connecting ends along the rivet to fold or unfold the frame.

In the example, the horizontal edges 61 of the two connecting ends are mutually butted when the frame is fully unfolded, thereby preventing the frame from being excessively rotated, and ensuring the strength of the frame.

In the aforementioned example, the connecting ends can be connected by a pin, and the same beneficial effect can be achieved as that by riveting.

In the invention, when the size of the frame is too large or the package size of the frame is required to be as small as possible, the side frames are provided with two or more pairs of folding points to enable the frame to be folded for two or more times, thereby making the area of the folded frame become smaller, and facilitating package and transportation. The frame can be forwards folded or backwards folded when being folded, in addition, a part of the frame can be backwards folded while the other part of the frame forwards folded, thereby further reducing the package size of the frame.

In the invention, the frame can be of a separated structure, and comprises a plurality of frame members; the frame is formed by the frame members, and the folding points are positioned on the frame members. Because the generality of the frame members is high, frame members with different number and length can form frames with different sizes. Thus, the cost of the frame is reduced, and the development cycle of the frame is shortened.

The invention is described in detail in accordance with the above contents with the specific preferred examples. However, this invention is not limited to the specific examples. For the ordinary technical personnel of the technical field of the invention, on the premise of keeping the conception of the invention, the technical personnel can also make simple deductions or replacements, and all of which should be considered to belong to the protection scope of the invention.

We claim:

1. A frame for an LCD device, comprising: side frames; wherein a pair of parallel side frames of said side frames are correspondingly provided with folding points, and said frame is folded and superposed along said folding points; said side frames provided with said folding points are formed with two connecting ends at said folding points, and said two connecting ends are riveted or connected by a pin; one connecting end of said two connecting ends is provided with a first through hole, said first through hole is provided with a folding edge of inner hole, the other connecting end is provided with a second through hole corresponding to said folding edge, and said two connecting ends are riveted by the folding edge and through holes thereof; each said side frame is L-shaped in the cross section thereof, and comprises a horizontal edge which is in parallel with the plane of said frame, and a vertical edge which is perpendicular to said horizontal edge; the vertical edges of said two connecting ends are mutually riveted or connected by a pin, and the horizontal edges of said two connecting ends are mutually butted when said frame is expanded; said frame is of a separated structure, and comprises a plurality of frame members; said frame is formed by said frame members, said folding points are positioned on the longer side frames, and said folding points are positioned in the middle of said longer side frames.

2. A frame for an LCD device, comprising: side frames; wherein a pair of parallel side frames of said side frames are correspondingly provided with folding points, and said frame is folded and superposed along said folding points, wherein said side frames provided with said folding points are formed with two connecting ends at said folding points, and said two connecting ends are riveted or connected by a pin, wherein one connecting end of said two connecting ends is provided with a first through hole, said first through hole is provided with a folding edge of inner hole, the other connecting end is provided with a second through hole corresponding to said folding edge, and said two connecting ends are riveted by the folding edge and through holes thereof.

3. The frame for an LCD device of claim 2, wherein each said side frame is L-shaped in the cross section thereof, and comprises a horizontal edge which is in parallel with the plane of said frame, and a vertical edge which is perpendicular to said horizontal edge; the vertical edges of said two connecting ends are mutually riveted or connected by a pin.

4. The frame for an LCD device of claim 3, wherein the horizontal edges of said two connecting ends are mutually butted when said frame is unfolded.

5. The frame for an LCD device of claim 2, wherein said folding points are positioned on the longer side frames, and said folding points are positioned in the middle of said longer side frames.

6. The frame for an LCD device of claim 2, wherein said side frames are provided with two or more pairs of folding points.

7. The frame for an LCD device of claim 2, wherein said frame is of a separated structure, and comprises a plurality of frame members; said frame is formed by said frame members, and said folding points are positioned on said frame members.

8. The frame for an LCD device of claim 2, wherein said frame is a front frame or a middle frame.

9. An LCD device, comprising: a frame; wherein said frame comprises side frames; a pair of parallel side frames of said side frames are correspondingly provided with folding points, and said frame is folded and superposed along said folding points, wherein said side frames provided with said folding points are formed with two connecting ends at said folding points, and said two connecting ends are riveted or connected by a pin, wherein one connecting end of said two connecting ends is provided with a first through hole, said first through hole is provided with a folding edge of inner hole, the other connecting end is provided with a second through hole corresponding to said folding edge, and said two connecting ends are riveted by the folding edge and through holes thereof.

10. The LCD device of claim 9, wherein each said side frame is L-shaped in the cross section thereof, and comprises a horizontal edge which is in parallel with the plane of said frame, and a vertical edge which is perpendicular to said horizontal edge; the vertical edges of said two connecting ends are mutually riveted or connected by a pin.

11. The LCD device of claim 10, wherein the horizontal edges of said two connecting ends are mutually butted when said frame is unfolded.

12. The LCD device of claim 9, wherein said folding points are positioned on the longer side frames, and said folding points are positioned in the middle of said longer side frames.

13. The LCD device of claim 9, wherein said side frames are provided with two or more pairs of folding points.

14. The LCD device of claim 9, wherein said frame is of a separated structure, and comprises a plurality of frame members; said frame is formed by said frame members, and said folding points are positioned on said frame members.

15. The LCD device of claim 9, wherein said frame is a front frame or a middle frame.

\* \* \* \* \*